INVENTOR.
RICHARD TOBEY
BY Robert G. Clay
ATTORNEY

June 17, 1969 R. TOBEY 3,450,973

TAPE TRANSPORT SYSTEM INCLUDING DEAD-BAND AMPLIFIER MEANS

Original Filed Sept. 6, 1963

INVENTOR.
RICHARD TOBEY

BY Robert G. Clay

ATTORNEY

United States Patent Office 3,450,973
Patented June 17, 1969

3,450,973
TAPE TRANSPORT SYSTEM INCLUDING DEAD-BAND AMPLIFIER MEANS

Richard Tobey, Tustin, Calif., assignor to Ampex Corporation, Redwood City, Calif., a corporation of California Continuation of application Ser. No. 307,117, Sept. 6, 1963. This application Apr. 18, 1966, Ser. No. 543,203
Int. Cl. H02p 5/06; H02k 27/20
U.S. Cl. 318—307 7 Claims

ABSTRACT OF THE DISCLOSURE

A magnetic tape transport system including an amplifier means coupled to energize a motor driving a capstan, the amplifier means including a "dead-band" operating characteristic. A bias diode arrangement clamps the amplifier output to the amplifier input in the absence of an input signal above a minimum predetermined reference level. When the input signal current exceeds the reference level, the diodes become back-biased to decouple the output from the input to permit normal amplification.

The present application is a continuation of United States patent application Ser. No. 307,117, filed Sept. 6, 1963, now abandoned and entitled "Amplifier Circuit."

This invention relates to an amplifier circuit, and in particular to an amplifier which provides dead-band operation, that is, an amplifier which provides no output signal unless the input signal is above predetermined minimum amplitude.

Generally, an amplifier should function to provide a large amplitude output signal representative of the signal applied to its input. Servo mechanisms commonly employ closed loop amplifiers to provide an amplified output signal proportional to the amount by which the input signal level varies from a predetermined level, usually zero although any given level can be selected. For proper operation, the output signal from the servo amplifier should also remain at a predetermined level in the absence of a true input signal. That is, the output signal should not change as a result of a small variation from the predetermined level at the input, such as may be due to drift or noise. Accordingly, such amplifiers are usually provided with a "dead-band" operating characteristic by virtue of which the amplifier is maintained inoperative unless the input signal exceeds a certain level which is above the level of any contemplated noise or input drift.

Previous direct current servo amplifiers commonly included a class B, push-pull type input stage with an input terminal connected to receive input signals from a source. The input signal was applied to the control electrodes of a pair of oppositely conducting electron tubes, transistors or the like, which were connected in push-pull fashion and which were normally cut off in the absence of an input signal. Depending upon the polarity of the input signal, one or the other of the amplifying devices in the push-pull arrangement was turned on to provide an amplified output signal from an output stage. Previously the dead-band operation of such amplifiers was provided by biasing each of the amplifying devices of the input stage to a voltage beyond cutoff to prevent operation until the input signal exceeded a predetermined minimum in either polarity. Additional circuit components, such as adjustable rheostats and temperature sensitive diodes, were often employed in order to supply accurately controlled bias levels to establish the dead-band limits. However, this dead-band operation could usually be accomplished only at the input stage of the amplifier so that noise or drift occurring in the latter stages of the amplifier might cause significant errors in the output. In fact, any drift occurring either at the input or elsewhere appeared at the output multiplied by the available gain.

Another common practice employed in the prior art to provide dead-band operation included the use of a passive dead-band circuit to receive the input to the amplifier. The passive dead-band circuit, one form of which would include a pair of oppositely biased diodes, was connected to the input terminal of the first amplifier stage, usually a differential type amplifier. While this approach might be used to provide insensitivity of the first stage to input noise, the amplifier operation remained sensitive to drift and noise occurring in the remaining stages.

The problems involved in providing dead-band operation are particularly acute in high gain servo systems of the velocity or integrating type, such as are used in tape transport systems for data recording. Typically, the magnetic tape or other recording medium is driven in a carefully controlled fashion from a supply to a takeup storage reel in a path adjacent a recording transducer. The nominal speed of the tape as well as the stop and start characteristics are determined by the speed of a capstan driving member when in contact with the tape, and in at least one system the capstan driving member is continually in contact with the tape and under the control of a velocity or integrating type of servo system. Likewise, where tape supply and storage reels are employed, the reels may also be driven by servo systems. The system is responsive to input command signals for driving the tape or other recording medium in a sequence of bidirectional movements. Because the data must be recorded upon the tape and retrieved therefrom with a high degree of precision, extremely accurate control of the position of the tape relative to the recording and reproducing transducers is required. The servo system, which may include a high gain direct current amplifier and a driving motor coupled to the capstan or reels, must include a dead-band characteristic to prevent undesired movements of the tape and reels in response to noise or drift of the input signal. Input drift can be a particularly serious problem where transistor amplifier circuits are employed since transistors exhibit operational characteristics which are temperature sensitive.

Therefore, it is an object of the present invention to provide a dead-band amplifier in which erroneous outputs due to noise, input drift, and drift within the amplifier are prevented.

Another object of this invention is to provide an improved high gain servo system wherein the output of the servo system is substantially unaffected by noise and drift in the absence of an input signal.

Another object of this invention is to provide an improved tape transport system wherein the position of the tape relative to the transducer elements is not changed due to noise or drift in the absence of an imput command signal.

Yet a further object of this invention is to provide an improved dead-band amplifier circuit employing transistor components.

These and other objects are accomplished in accordance with the invention by providing an amplifier circuit having a biased diode arrangement for clamping the output terminal to the input terminal in the absence of an input signal above a minimum level. With the output terminal coupled to the input terminal, closed-loop gain of the amplifier is negligibly small. Smaller variations in the input signal resulting from noise or input drift are insufficient to cause decoupling of the amplifier output terminal from the input terminal, and this coupling prevents amplification of noise or amplifier drift which may occur during the absence of a true input signal. In accordance with one aspect of this invention, positive and negative voltage sources are connected through associated resistors of properly proportioned values to bias the diodes in the forward direction so that the input terminal of the amplifier is directly coupled to the output terminal. A first pair of diodes are connected in the forward conducting direction, one on either side of the input terminal between an associated one of the resistors and the input terminal. A reference current is primarily determined by the sum of the two voltage sources and their associated resistors. The diodes are maintained in their conducting state whenever the current at the input terminal does not exceed the predetermined reference level. Another pair of diodes are likewise connected in the forward direction, one on each side of the output terminal of the amplifier, to the junction between each of the previously mentioned diodes and their respective resistors.

In closed-loop amplifiers, a polarity reversal of the signal occurs between the input and output terminals. Thus, unless the input signal to the amplifier is sufficient to decouple the output terminal from the input terminal by back biasing two of the diodes, the output signal will not change appreciably, since the closed-loop gain is substantially zero due to the direct coupling between output and input which the forward biased diodes provide. However, when the input signal current is above the level of the predetermined reference level, one of the diodes between the input terminal and the resistor together with one of the diodes between the output and the resistor are back biased to decouple the output from the input thereby permitting normal amplification.

In accordance with one particular aspect of the invention, equal positive and negative voltage supply sources may be connected through resistors of equal value to provide a stable predetermined level (in this case zero, although the voltages and resistors may be chosen for any other desired level) to the input terminal of the amplifier. A first pair of diodes connected on each side of the input terminal in the forward conducting direction, and another pair of forward conducting diodes are likewise connected on either side of the output terminal of the amplifier to permit flow of a predetermined reference current between the voltage sources. With this particular arrangement, a dead-band is provided extending in equal directions on both sides of the predetermined zero level so that an input signal current of either polarity decouples the output terminal from the input terminal if it is above the predetermined absolute value of the reference current.

Dead-band amplifiers in accordance with the invention may be employed to provide driving current to the capstan motor of tape transport systems, in which the capstan is continually in contact with the tape and is directly controlled by a velocity type servo system, to prevent movement of the tape in the absence of any true input command signal, thereby preventing erroneous positioning of the tape relative to the transducer elements.

A better understanding of the invention may be had by reference to the following detailed description, taken in conjunction with the accompanying drawings in which.

Figures 1, 2:
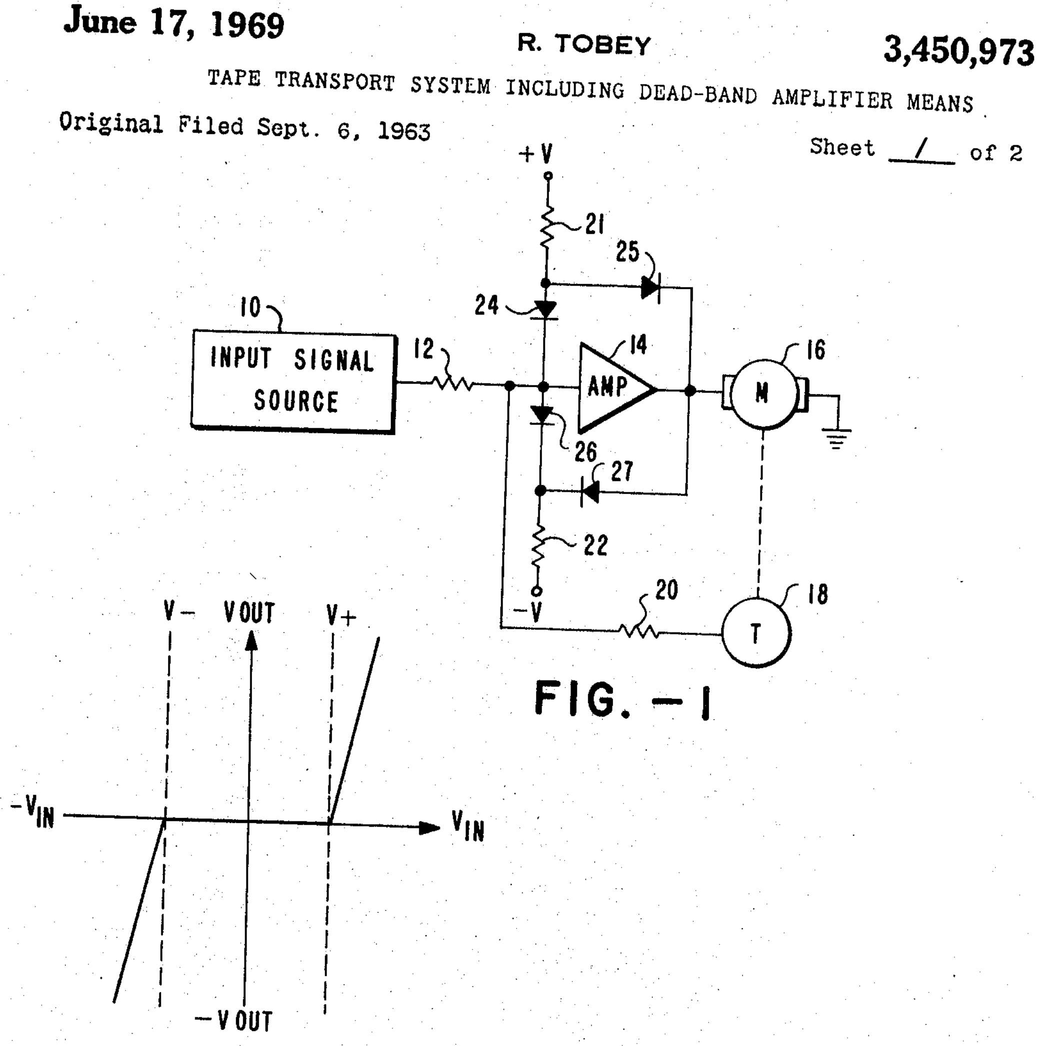
FIGURE 1 is a simplified circuit diagram illustrating the basic concepts of a dead-band amplifier in accordance with the invention.
FIGURE 2 is a graphical representation of the operating characteristic of a dead-band amplifier in accordance with the invention.

Referring now to FIG. 1, a typical servo system is shown in simplified form wherein an input signal obtained from the source 10 is connected through an input resistor 12 to the input terminal of a direct current amplifier

14. The amplifier 14 provides an output signal to a servo motor 16 representative of the magnitude of the input signal, but of opposite polarity. The direct current servo motor 16, which for example may be of a type having a substantially linear current to speed characteristic, rotates at a speed and in a direction represented by the magnitude and polarity of the input signal of the source 10. The servo motor 16 is typically coupled to a tachometer 18 which generates a voltage proportional to the motor speed to be applied as a negative feedback signal through a feedback resistor 20 to the input of the amplifier 14 to thereby reduce the magnitude of the applied input signal.

The amplifier 14 is provided with a dead-band type operation in accordance with the invention by connecting the voltage sources +V and −V through the respective resistors 21 and 22, and connecting the other side of the resistors 21 and 22 through an arrangement of unidirectionally conducting diodes 24, 25, 26 and 27 to both the input and the output terminals of the amplifier 14, each of the diodes 24, 25, 26 and 27 being connected in the forwardly conducting direction with respect to the voltage sources +V and −V. The resistance values of the resistors 21 and 22 are so proportioned that in the absence of an input signal from the source 10, the input terminal to the amplifier 14 is maintained at a predetermined initial potential level, usually zero. For example, if the voltage +V is equal to +10 volts and the voltage −V is equal to −5 volt, and assuming that the input terminal to the amplifier is to be maintained at an initial zero potential in the absence of an input signal from the source 10, then resistor 21 should have a value twice that of resistor 22.

In operation, the dead-band limits of the amplifier 14 are determined by the absolute values of the voltages +V and −V, as shown in the graphical illustration of FIG. 2. For the purpose of simplifying the following explanation of the operation, the voltages +V and −V as well as the values of the resistances 21 and 22 will be considered equal to provide equal dead-band limits on either side of a predetermined zero potential. Also, it will be assumed that the predetermined reference current flowing from +V to −V through the resistors 21 and 22 is equal to one milliampere. When a positive input signal from the source 10 is applied to the input resistor 12, and additional current is caused to flow through the directional diode 26, and since the sum of the currents through the two diodes 26, 27 is constant, less current is caused to flow through the directional diode 27. Accordingly, the potential of the input terminal of the amplifier 14 tends to rise. However, the polarity reversal provided by the amplifier 14 causes a greater increase in the negative direction at the output terminal, thereby increasing the current flow through the diode 25, at the same time, since the sum of the currents through 24, 25 is held constant by the resistor 21, decreasing the current through diode 24. Thus, in the absence of an input current more than one milliampere, the input terminal is effectively clamped through the diodes 24, 25, 26 and 27 to the output terminal of the amplifier 14, and the input and output terminals are both maintained at the predetermined zero level.

However, when the input signal from the source 10 becomes greater than one milliampere it is sufficient to cause all the current flowing through the resistor 22 to flow through diode 26. Accordingly, the diodes 24 and 27 have no current flow and are back biased thereby decoupling the output terminal from the input terminal of the amplifier 14 and the input terminal to the amplifier 14 assumes a positive potential. The amplifier 14 then operates in a normal manner to amplify the input signal and provide current to the windings of the motor 16.

Therefore, a dead-band amplifier constructed in accordance with this invention uses only a few additional noncritical elements in addition to the normal amplifier components to provde a highly stable dead-band operation between closely controlled limits, although the amplifier itself exhibits high gain characteristics for good servo performance outside the dead-band limits. Furthermore, dead-band limits are accurately determined and may be maintained without the use of temperature compensating circuits and without the need for complicated readjustments and tests before each use. Thus, the motor 16 is not permitted to rotate in the absence of a true input signal as long as dead-band limits, as determined by the reference current, are maintained slightly above the maximum input error expected from noise and input drift.

Figure 3:
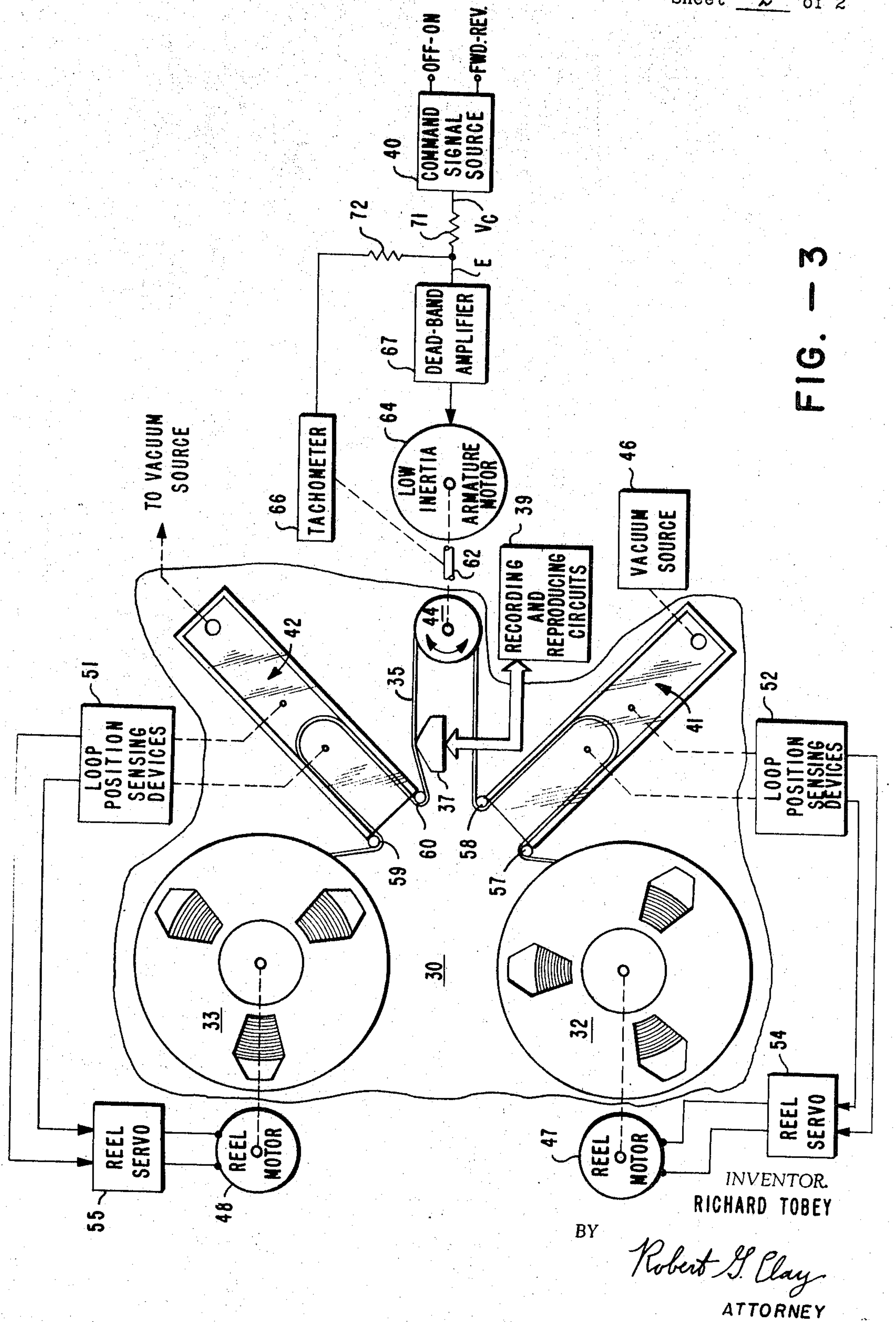
FIGURE 3 is a combined, simplified elevational view, partially block diagram form, of a magnetic tape transport system utilizing dead-band characteristics in accordance with the invention.

A typical digital tape transport system, such as may employ a servo system including the dead-band amplifier of the present application to good advantage, is illustrated in FIG. 3 as to its general organization. The details of this particular system which are not concerned with particular aspects of the present invention have either been omitted or been illustrated generally where possible in order to simplify the description, since they have previously been described in the copending U.S. applications of Robert A. Kleist entitled "Drive System for Tape Transport Systems," Ser. No. 267,175, filed Mar. 22, 1963, now United States Patent 3,185,364, Robert A. Kleist and Ben C. Wang entitled "Magnetic Tape Transport System," Ser. No. 268,140, filed Mar. 26, 1963, now United States Patent 3,251,563; and of Martyn A. Lewis entitled "Motor Drive Circuit," Ser. No. 267,166, filed Mar. 22, 1963, now United States Patent 3,293,522, all of which are assigned to the assignee of the present invention. The mechanical elements of this tape transport system are mounted on a front panel 30, and include a tape supply reel 32 and a tape take-up reel 33, the designations "supply" and "take-up" being used solely for convenience, between which the tape 35 is moved bidirectionally in a low friction, relatively low tension tape path. Tape 35 is driven in a forward or reverse direction past a magnetic head assembly 37 coupled to recording and reproducing circuits 39 which may be interconnected with an associated data processing system (not shown). The data processing system or some other related means provides the forward and reverse, and off and on signals to the command signal source 40 for controlling the tape transport mechanism. Inasmuch as the transfer of data to and from the data processing system and the provision of these control signals may be achieved by conventional means, no further explanation is provided herein.

The tape supply and take-up reels 32 and 33, a pair of vacuum chambers 41 and 42, and a centrally disposed drive capstan 44 are arranged symmetrically in a compact configuration in the front panel 30. Each of the vacuum chambers 41 and 42 is positioned between the capstan 44 and a respective one of the reels 41 or 42 to effect mechanical decoupling of the tape path in the region of the recording and reproducing circuits 39 from the high inertia reels 41 and 42. Each chamber includes a vacuum port coupled to a vacuum source 46 so that the tape may be drawn into the chamber to form a loop of variable length which constitutes the buffer needed for mechanical decoupling. Capstan 44 is typically driven in a regular sequence of forward and reverse motions, but the relatively slower acting reels 32 and 33 need not have similar movements since the buffers provided by the vacuum chambers absorb the relatively fast changes in tape movements between the chambers. In order to maintain the length of the tape loop with selected limits, each of the reels 32 and 33 is driven by an associated reel motor 47 or 48 respectively, which is coupled in a servo loop deriving driving signals from a pair of position sensing holes in the sides of the chambers. Loop position sensing devices 51 and 52 could, for example, be differential pressure switches or photosensitive switches coupled to the sensing holes, to provide error signals to the reel servo circuits 54 and 55, respectively, to control movement of the connected reel motor 47 or 48, so that the reels 32 and 33 are turned appropriately to withdraw tape from or supply tape to the vacucm chambers during operation. This system for driving the reels 32 and 33, and other conventional modifications of this sytem, such as the use of other forms of loop sensing and servo systems, are well understood by those skilled in the art.

In other respects, however, this tape transport system is materially different from other prior systems inasmuch as there is no high tension, high friction or high impact forces in the tape path. The two chambers 41 and 42 maintain substantially equal tension on the tape 35 and have two low friction guides 57, 58 and 59, 60 at the entrance and exit ends of the two chambers 41 and 42, respectively, which, together with the contact of the tape 35 at the chamber walls and at the magnetic head assembly 37, produce the only frictional or inertial forces within the tape path to resist tape movement by the capstan 44. On the other hand, a highly frictional and partially resilient surface on the drive capstan 44, such as a rubber or rubber-like surface, is preferred so that tension on the tape 35 may be maintained at a relatively low value, in the order of 0.3–5 pounds.

The absence of friction in the tape path, along with the presence of low inertia compliance mechanisms, insures that the tape 35 is driven solely by the action of the capstan 44. In addition, since the tape tension need be only in excess of that level needed to maintain good frictional contact with the capstan 44 during acceleration, the tension can be maintained at a sufficiently low level to preclude introduction of any material loading which must be overcome in turning the capstan 44 to move the tape 35. The inertia of the capstan 44 plus that of the motors used to drive the capstan is substantially an order of magnitude greater than the inertia and frictional forces along the tape path. Thus, the movement of the capstan is determinative of the movement of the tape 35.

This facility for direct control of the tape movement by control of the capstan 44 may be utilized in a cooperative relationship with electronic means for generating control signals for the precise control of the start, stop and nominal speed characteristics of the tape movement. Accordingly, the capstan 44 is directly coupled by a motor shaft 62 to a motor 64 having a high torque-to-inertia ratio such as the direct current type of motor containing a planar rotor with windings disposed as printed circuit conductors thereon. This type of motor 64 is preferable since it not only has low armature inertia but also has a substantially linear torque versus current characteristic over a relatively wide range. Thus, when coupled to a mechanical system having a very low and substantially constant counter-torque, the magnitude and polarity of the applied current may be used to actively and completely control the operation of the mechanical system. The linear characteristic is not needed, however, as long as the torque characteristic continues to increase with increasing current.

In this type of a tape transport system, both the precise control of start and stop characteristics and the servo control needed to maintain nominal velocity may be provided for example, by single servo system including a tachometer 66 for providing a feedback signal and a dead-band amplifier 67 for providing current flow in either direction to the winding of the motor 64. In response to a forward-reverse and off-on signal applied to the command signal source 40 from the data processing system or the like, a positive or negative polarity signal of an amplitude representative of a desired nominal velocity is applied through an input impedance, generally illustrated as the resistor 71, to the input of the amplifier 67. The tachometer 66 provides its negative feedback signal through a feedback impedance, generally illustrated as the resistor 72, to proportionately decrease the amplitude of the input signal to the amplifier 67 as the tape approaches the desired velocity.

Amplifier 67 may have a high gain and a stable output level at saturation so that, for all input signals of either polarity above a selected amplitude level representing the desired dead-band, the output current to the motor windings is held constant. The input saturation level of the amplifier 67 may be so chosen as to be an order of magnitude below the amplitude of the reference signal received from the reference signal source 40. Inasmuch as the feedback signal from the tachometer 66 is not sufficient to reduce the input signal to the amplifier 67 below the selected saturation level until the motor speed closely approaches nominal velocity, the motor 44 supplies a constant high torque acceleration.

Alternatively, a very precise control of the capstan as well as the reel servos may be provided in the manner described in the copending application of Robert A. Kleist, Martyn A. Lewis, and Ben C. Wang entitled "Motor Drive Circuits," Ser. No. 307,161, which is assigned to the assignees of the present invention and filed Sept. 6, 1963, now U.S. Patent 3,379,948. Also, the reel servos 54 and 55 may be similarly controlled as described in the copending application of Harold A. Kurth entitled "Web Transport System," Ser. No. 307,124, assigned to the same assignees and filed Sept. 6, 1963, now U.S. Patent 3,304,018.

However, such tape transport systems as described are particularly sensitive to low level changes in the level of voltage applied to the input of the servo system in the absence of an input command signal from the source 40. Due to the high gain of the amplifier 67 and the low power needed to move the tape 35, even these small changes may result in movement of the capstan 44, thereby causing the tape to advance an undesired distance in either direction. This could result in large amounts of information being erased or otherwise lost during operation. Therefore, it is essential that the amplifier 67 be provided with a dead-band which prevents movement of the tape in the absence of a true input signal from the source 40. Also, it is commonly the practice to use transistorized components which are particularly susceptible to input drift from temperature changes when connected in a manner to provide the direct current amplification of the input signal to the amplifier 67.

Figure 4:
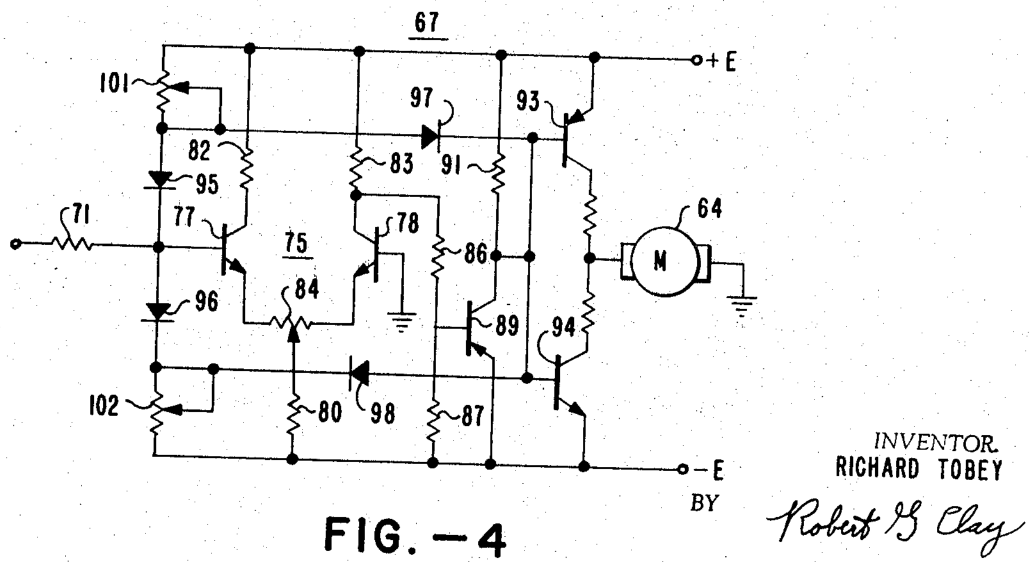
FIGURE 4 is a simplified circuit diagram illustrating a transistorized dead-band amplifier coupled to drive a motor in accordance with the invention.

Referring now to FIG. 4, there is illustrated a dead-band, direct current amplifier 67 having transistor components for providing driving current to the motor 64. It should be noted that the amplifying components of the amplifier 67 are conventional and that the dead-band characteristics are provided by a few additional elements. The input command signals are provided through the input resistor 71 to an input stage in the form of a differential amplifier 75 consisting of two matched NPN transistors 77 and 78 connected through a common emitter resistor 80 to a negative potential source −E. The collectors of the two transistors 77 and 78 are connected in conventional fashion to equal resistors 82 and 83 to a positive potential source +E. The base of the transistor 77 is connected to the input terminal whereas the base of transistor 78 is connected to a ground reference midway the +E and −E potential levels. A small variable potentiometer 84 may be connected between the emitter of the two transistors 77 and 78 to balance the circuit operation for individual transistor differences.

When no input signal is being received at the base of the transistor 77, both transistors 77 and 78 conduct equal amounts of current. However, if the potential at the base of the transistor 77 is raised by an input signal, the transistor 77 begins to conduct more current thereby raising the potential at the emitter at the transistor 78 causing it to conduct proportionately less current. Conversely, a negative input signal causes the transistor 77 to conduct less current and the transistor 78 to conduct proportionately more current. The output from this differential amplifier is obtained from the collector of the transistor 78 and applied across a voltage divider circuit consisting of resistors 86 and 87. The junction between the resistors 86 and 87 is connected to the base of a linearly conducting PNP transistor 89 to change its resistance to the flow of current. The transistor 89 forms a variable resistor in a voltage divider network with the fixed resistor 91, the value of which is so chosen that the collector terminal of the transistor 89 is at zero potential in the absence of an input signal to the transistor 77. A positive input signal causes the resistance of the transistor 89 to decrease proportionately thus causing a drop in the voltage of its collector, whereas a negative input signal causes an increase in the voltage at its collector. Thus the original input signal becomes amplified in magnitude and reversed in polarity and is applied to the bases of a pair of oppositely conducting power transistors 93 and 94 connected to deliver current from the +E and −E supplies to the windings of the servo motor 64.

Four diodes 95, 96, 97 and 98 are connected between the input terminal of the amplifier and the collector output of the transistor 89, which serves as the output terminal of the amplifier, to provide the dead-band operation of the amplifier in the manner previously described. The width of the dead-band is determined by the setting of the movable contact on the potentiometers 101 and 102, which are set to provide reference currents of equal magnitude and opposite polarity. Thus, the collector of the transistor 89 is clamped to the input terminal of the amplifier until an input current caused to flow through resistor 71 by an input voltage is received which exceeds the reference currents provided by the potentiometers 101 and 102.

It should be appreciated that by the use of the circuitry in accordance with this invention the output of the amplifier so long as it represents a polarity reversal from the input may be coupled back across any number of stages to the input terminal to provide the dead-band operation to thereby prevent erroneous output signals due to input drift or noise. Previously, dead-band operation was most commonly accomplished by applying appropriate bias voltages to oppositely conducting push-pull connected elements in the input stage only. Therefore, noise and input drift introduced at later stages in the amplification process could result in erroneous outputs from the amplifier unless the later stages were also biased to provide dead-band operation. Proper biasing by these previous methods was accomplished by use of many additional components which required critical adjustments and temperature compensation. Furthermore, dead-band operation could not be realized unless the first stage was of a push-pull class B type amplifier circuit, thereby preventing the use of the highly desirable differential type amplifier in the input stage, such as shown in FIG. 4. Therefore, the present invention provides a means for achieving dead-band amplifier operation for a direct current amplifier of any convenient circuit configuration without the necessity of including a push-pull class B amplifier or passive dead-band circuit at the input stage.

This invention has been described in connection with a magnetic tape transport system for use in recording and reproducing digital data since this furnishes one of the best examples of the very particular requirements which must be met by present day servo systems. These tape transport systems, particularly those used for digital data processing applications, must use high gain amplifiers which are required to respond with great precision only to input signals and must accordingly operate without producing erroneous output signals due to drift or noise. However, like requirements are to be found in a number of other servo and other type systems employing direct current amplifiers, and accordingly the invention should be considered to be applicable to all such systems.

It should be understood that various changes in the details, which have been herein described and illustrated in order to explain the nature of the invention, may be made by those skilled in the art within the principle and scope of the invention as expressed in the appended claims.

What is claimed is:

1. A digital magnetic tape transport system of the single capstan type comprising: a high-torque-to-inertia ratio motor directly coupled to and bidirectionally driving the capstan; amplifier means coupled to energize said motor, the amplifier means having input and output terminal means and providing a polarity reversal of an applied input signal, bias means including a voltage source providing a predetermined reference current level, first unidirectional means extending between said input terminal means and said bias means, second unidirectional means joining the junction of the bias means and the first unidirectional means and extending to said output terminal means, said first and second unidirectional means being connected in the forward conducting direction with respect to said source; and means coupled to the amplifier input terminal means for providing command signals thereto; whereby said output terminal is clamped through said first and second unidirectional means to said input terminal means whenever the signals to the input terminal means are below a predetermined level.

2. The invention as set forth in claim 1 above, wherein the amplifier means is part of a servo amplifier, and wherein the system further includes speed sensing means coupled to said motor and providing a velocity feedback signal to said servo amplifier.

3. The invention as set forth in claim 2 above, wherein said amplifier means comprises a differential amplifier.

4. A digital magnetic tape transport system of the type in which the movement of the tape is governed by a capstan continually in contact with the tape and directly controlled by a velocity type servo system and comprising: means providing command signals; a high-torque-to-inertia ratio motor coupled to the capstan; high gain servo amplifier means receiving said command signals and coupled to control said motor, said high gain amplifier means comprising a direct current amplifier having an input and output terminal and being responsive to the level of an applied input signal to provide a polarity reversal and amplification thereof at its output terminal, a first pair of unidirectional means connected in series opposing relationship between said input terminal and said output terminal, a second pair of unidirectional means also coupled in series opposing relationship between said input terminal and said output terminal, biasing means including positive and negative voltage sources for providing forward biasing to said first and second pairs of unidirectional means, and first and second resistors connecting said positive and negative voltage sources to the junction between said first and second pairs of unidirectional means respectively, both said first and second pairs of said unidirectional means being connected to conduct a reference current in a forward direction between said positive and negative voltage sources so that said output terminal is directly connected through said first or second pairs of unidirectional means to said input terminal whenever the applied input signal is below said predetermined level; and speed sensing means coupled to said motor and providing a velocity signal to said servo amplifier means.

5. The invention as set forth in claim 4 above, wherein said servo amplifier means comprises a differential amplifier stage and a power amplifier stage, and wherein said first and second pairs of unidirectional means are coupled about said differential amplifier.

6. In a tape transport system wherein the tape is driven directly by a capstan device in accordance with the rotational speed of a servo motor which is connected in a velocity type servo system, a servo amplifier within said servo system comprising a direct current amplifier having input and output terminals and being responsive to the level of an applied error signal to provide a polarity reversal and amplification of the error signal at its output terminal, a first pair of unidirectional means connected in series opposing relationship between said input terminal and said output terminal of the amplifier, a second pair of unidirectional means also coupled in series opposing relationship between said input terminal and said output terminal, biasing means including equal positive and negative voltage sources providing voltage magnitudes and first and second resistors of equal value connecting said positive and negative voltage sources to the junction between said first and second pairs of unidirectional means, said first and second pairs of unidirectional means being connected to conduct current in a forward direction between said positive and negative voltage sources so that said output terminal is directly connected through said first or said second pairs of unidirectional means to said input terminal whenever the applied error signal is below a predetermined level at which the current flow through one of said resistors is double said reference current, the output terminal being connected to actuate the servo motor at a speed proportional to the magnitude of the amplified error signal appearing at the output terminal, whereby the servo motor is not actuated unless the applied error signal is about the predetermined level.

7. The invention as set forth in claim 4 wherein the values of said voltage sources and said resistors are so proportioned that in the absence of an input signal, the input terminal is maintained at a predetermined initial potential level.

References Cited

UNITED STATES PATENTS

| | | | |
|---|---|---|---|
| Re. 25,491 | 12/1963 | Lee et al. | 318—18 |
| 3,046,463 | 7/1962 | Johnson | 318—307 X |
| 3,293,522 | 12/1966 | Lewis | 318—327 |
| 3,383,578 | 5/1968 | Lewis | 318—332 |

ORIS L. RADER, *Primary Examiner.*

H. HUBERFELD, *Assistant Examiner.*

U.S. Cl. X.R.

318—18, 327, 345; 307—264; 330—40, 138